United States Patent
Shimizu et al.

(10) Patent No.: US 7,294,558 B2
(45) Date of Patent: Nov. 13, 2007

(54) METHOD AND APPARATUS FOR CLEAVING A WAFER THROUGH EXPANSION RESULTING FROM VAPORIZATION OR FREEZING OF LIQUID

(75) Inventors: Noriko Shimizu, Yokohama (JP);
Shinya Takyu, Kitakatsushika-gun (JP);
Tetsuya Kurosawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 257 days.

(21) Appl. No.: 11/072,331

(22) Filed: Mar. 7, 2005

(65) Prior Publication Data
US 2005/0196899 A1    Sep. 8, 2005

(30) Foreign Application Priority Data
Mar. 8, 2004    (JP) .............. 2004-064222

(51) Int. Cl.
*H01L 21/30* (2006.01)
*B26B 7/10* (2006.01)
*B26F 3/00* (2006.01)

(52) U.S. Cl. .............. 438/458; 257/E21.499; 83/15; 225/93

(58) Field of Classification Search .............. 438/106, 438/110, 113, 114, 460, 462, 464, 465; 261/127; 83/15, 22; 225/93
See application file for complete search history.

(56) References Cited

U.S. PATENT DOCUMENTS 4,775,085 A * 10/1988 Ishizuka et al. .............. 225/105
5,362,681 A * 11/1994 Roberts et al. .............. 438/464

FOREIGN PATENT DOCUMENTS

| JP | 55-145354 A | * | 11/1980 |
| JP | 61-90443 A | * | 5/1986 |
| JP | 1-200912 | * | 8/1989 |
| JP | 2-34956 | * | 2/1990 |
| JP | 9-323300 | | 12/1997 |
| JP | 2000-124159 | | 4/2000 |
| JP | 2001-257180 | | 9/2001 |
| JP | 2002-198326 | | 7/2002 |
| JP | 2002-373868 | | 12/2002 |
| JP | 2003-334675 | | 11/2003 |

OTHER PUBLICATIONS

Notification of Reasons for Rejection in the First Examination issued by the State Intellectual Property Office of the People's Republic of China, dated Jan. 26, 2007, for Chinese Patent Application No. 200510053418.

* cited by examiner

*Primary Examiner*—Scott B. Geyer
(74) *Attorney, Agent, or Firm*—Finnegan, Henderson, Farabow, Garrett & Dunner, L.L.P.

(57) ABSTRACT

A starting point for cleavage made up of at least one of a groove and a through hole is formed on a chip dividing line or a dicing line along the cleaved surface of a wafer. Liquid matter is injected into the starting point. Then, the liquid matter is changed by applying an external factor that changes the liquid matter physically. Making use of the change, the wafer is cleaved so as to divide the wafer into semiconductor chips.

16 Claims, 7 Drawing Sheets

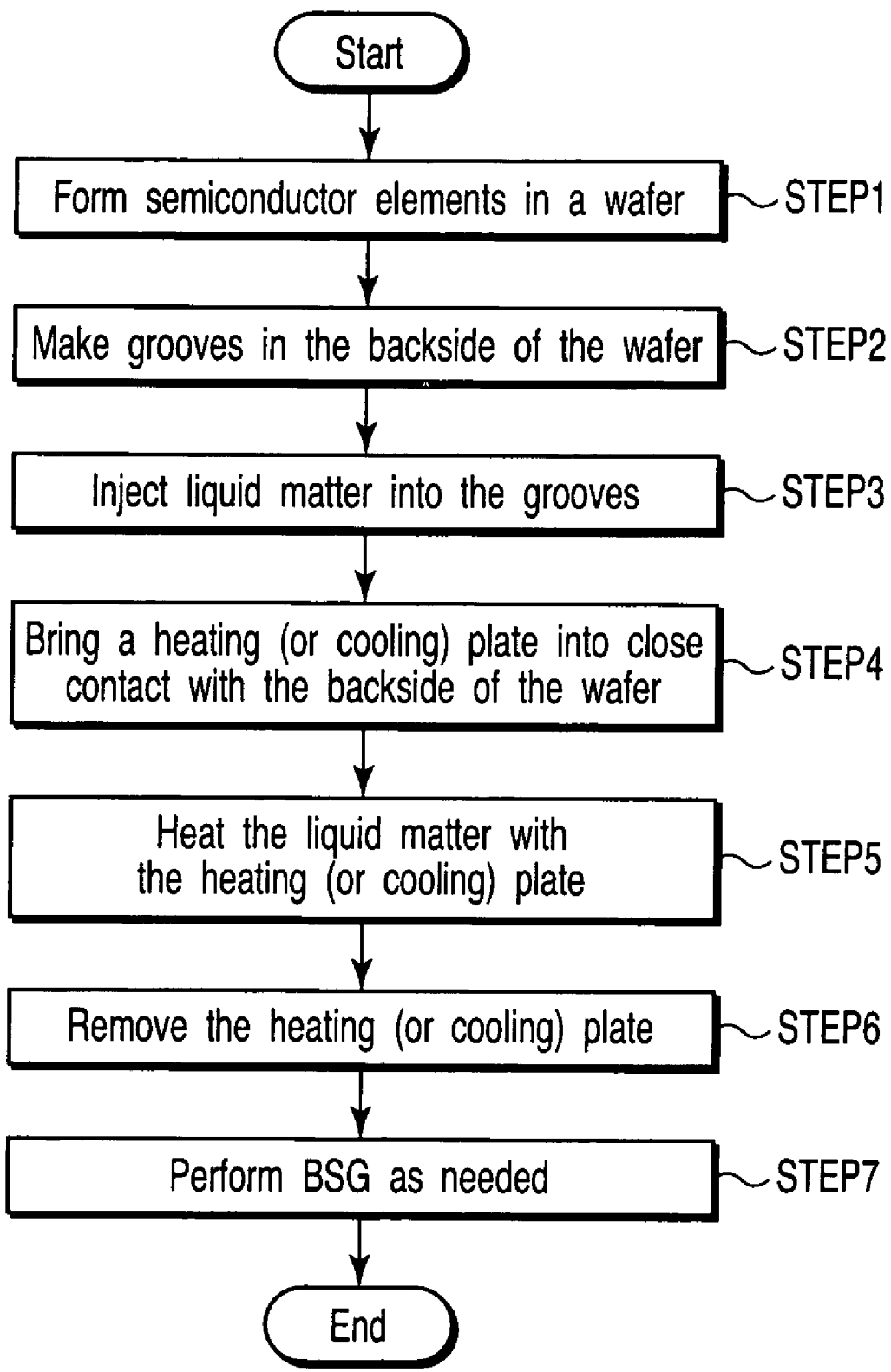
F I G. 9

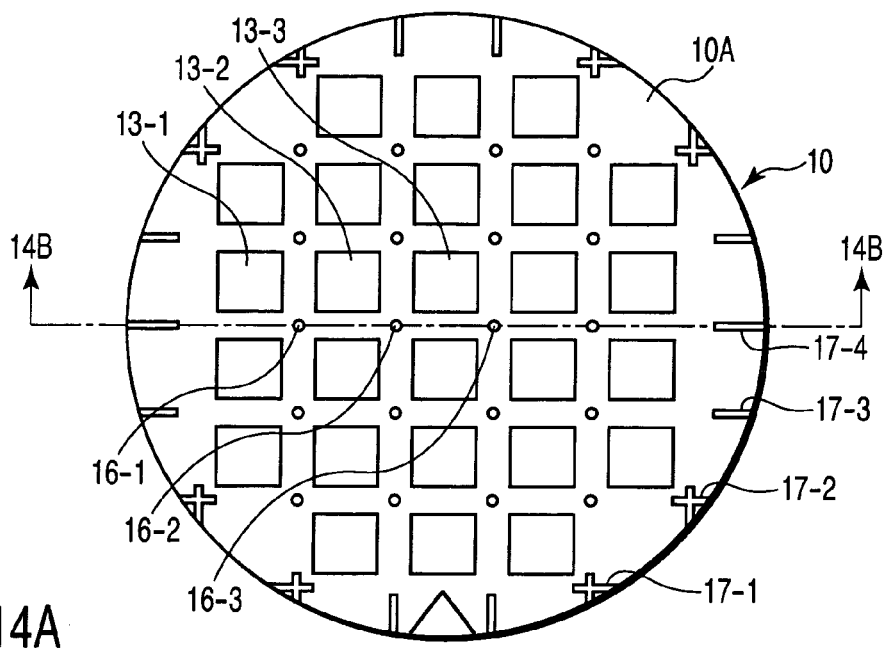
F I G. 14A
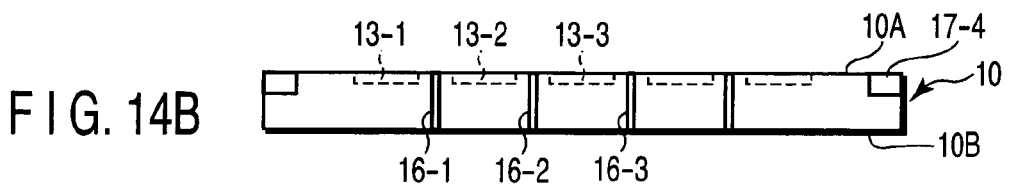
F I G. 14B
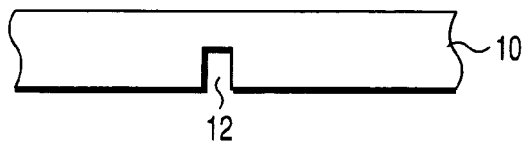
F I G. 15
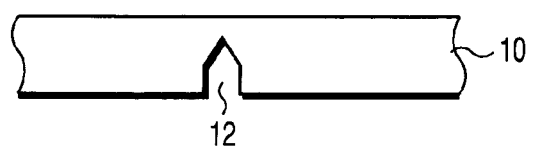
F I G. 18
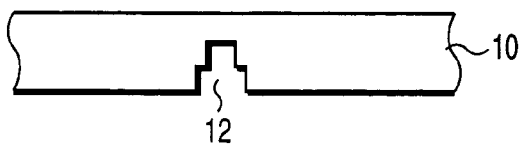
F I G. 16
F I G. 19
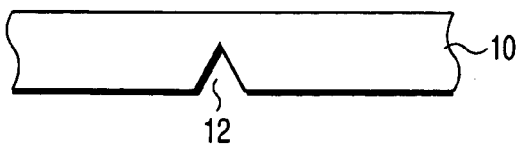
F I G. 17

METHOD AND APPARATUS FOR CLEAVING A WAFER THROUGH EXPANSION RESULTING FROM VAPORIZATION OR FREEZING OF LIQUID

CROSS-REFERENCE TO RELATED APPLICATIONS

This application is based upon and claims the benefit of priority from prior Japanese Patent Application No. 2004-064222, filed Mar. 8, 2004, the entire contents of which are incorporated herein by reference.

BACKGROUND OF THE INVENTION

1. Field of the Invention

This invention relates to a semiconductor device manufacturing method and a semiconductor device manufacturing apparatus, and more particularly a wafer dividing method and apparatus for dividing a wafer in which semiconductor elements have been formed, thereby forming semiconductor chips.

2. Description of the Related Art

In forming semiconductor chips by dividing a wafer in which semiconductor elements have been formed, for example, grooves or holes have been made in the surface of the wafer (or the semiconductor element formation face) by means of a diamond pen or the like and pressure has been applied mechanically, with each groove or hole as a starting point, thereby cleaving the wafer (refer to, for example, Jpn. Pat. Appln. KOKAI Publication No. 2000-124159, Jpn. Pat. Appln. KOKAI Publication No. 2001-257180, and Jpn. Pat. Appln. KOKAI Publication No. 2002-198326). Alternatively, a laser beam has been irradiated to form modified layers in the wafer and pressure has been applied mechanically, with each modified layer as a starting point, thereby cleaving the wafer (refer to, for example, Jpn. Pat. Appln. KOKAI Publication No. 2003-334675). Cleaving and dividing a wafer makes it possible to reduce the effect of chipping or cracking due to mechanical or thermal damage caused in dicing, which improves the strength of the semiconductor chips. As a result, when chips are made thinner, a decrease in the strength can be alleviated.

However, with such conventional dividing methods, it is difficult to optimize the external force at the time of cleaving. Since the application of more external force than necessary causes a semiconductor chip to crack or chip or the interference between semiconductor chips causes a crack or a chip, the shape of the cut surface cannot be made uniform, resulting in a decrease in the production yield. In the semiconductor device manufacturing method using the above dividing method, since cleaving is performed on a chip dividing line basis or a dicing line basis, the number of chips obtained from a single wafer increases as a result of the increase of the wafer size or the reduction of the chip size and therefore the time required to carry out the dividing step gets longer.

BRIEF SUMMARY OF THE INVENTION

According to an aspect of the present invention, there is provided a wafer dividing method comprising: forming a starting point for cleavage made up of at least one of a groove and a through hole on a chip dividing line or a dicing line along the cleaved surface of a wafer; injecting liquid matter into the starting point for cleavage; and changing the liquid matter by applying an external factor that changes the liquid matter physically and, by use of the change, cleaving the wafer so as to divide the wafer into semiconductor chips.

According to another aspect of the present invention, there is provided a semiconductor device manufacturing method comprising: forming a region serving as a starting point for cleavage made up of at least one of a groove and a through hole on a chip dividing line or a dicing line along the cleaved surface of a wafer in which semiconductor elements are formed; injecting liquid matter into the region serving as a starting point for cleavage; and changing the liquid matter by applying an external factor that changes the liquid matter physically and, by use of the change, cleaving the wafer so as to divide the wafer into semiconductor chips.

According to still another aspect of the present invention, there is provided a wafer dividing apparatus comprising: a first mechanism configured to form a region serving as a starting point for cleavage made up of at least one of a groove and a through hole on a chip dividing line or a dicing line along the cleaved surface of a wafer; a second mechanism configured to inject liquid matter into the region serving as the starting point for cleavage; and a third mechanism configured to change the liquid matter by applying an external factor that changes the liquid matter physically, the change of the liquid matter being used to cleave the wafer so as to divide the wafer into semiconductor chips.

According to still another aspect of the present invention, there is provided a semiconductor device manufacturing apparatus comprising: means for forming a region serving as a starting point for cleavage made up of at least one of a groove and a through hole on a chip dividing line or a dicing line along the cleaved surface of a wafer in which semiconductor elements are formed; means for injecting liquid matter into the region serving as a starting point for cleavage; and means for changing the liquid matter by applying an external factor that changes the liquid matter physically, the change of the liquid matter being used to cleave the wafer so as to divide the wafer into semiconductor chips.

BRIEF DESCRIPTION OF THE SEVERAL VIEWS OF THE DRAWING

FIG. 9 is a process flowchart to help explain the semiconductor device manufacturing method of the first embodiment;

FIG. 14A is a plan view of the backside of a wafer to help explain a semiconductor device manufacturing method and apparatus according to a sixth embodiment of the present invention;

FIG. 14B is a sectional view taken along line 14B-14B of FIG. 14A;

FIG. 15 is a sectional view to help explain a shape of the cross section of a groove;

FIG. 16 is a sectional view to help explain another shape of the cross section of a groove;

FIG. 17 is a sectional view to help explain still another shape of the cross section of a groove;

FIG. 18 is a sectional view to help explain still another shape of the cross section of a groove; and FIG. 19 is a sectional view to help explain still another shape of the cross section of a groove.

DETAILED DESCRIPTION OF THE INVENTION

FIRST EMBODIMENT

Figure 5:
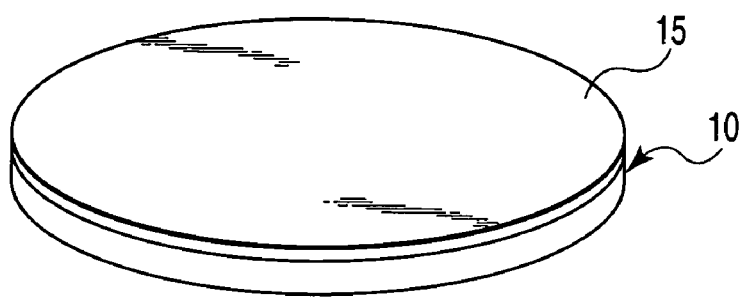
Figure 6:
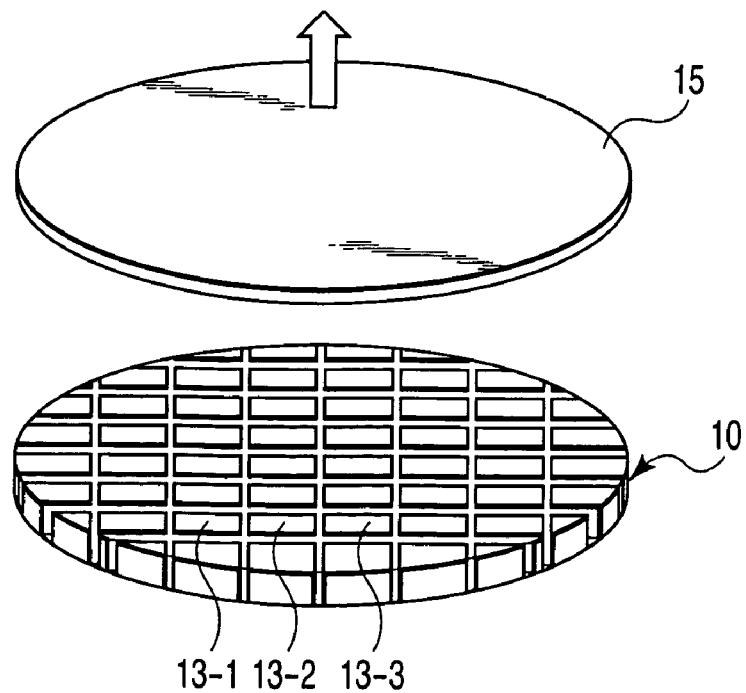
Figure 7A:
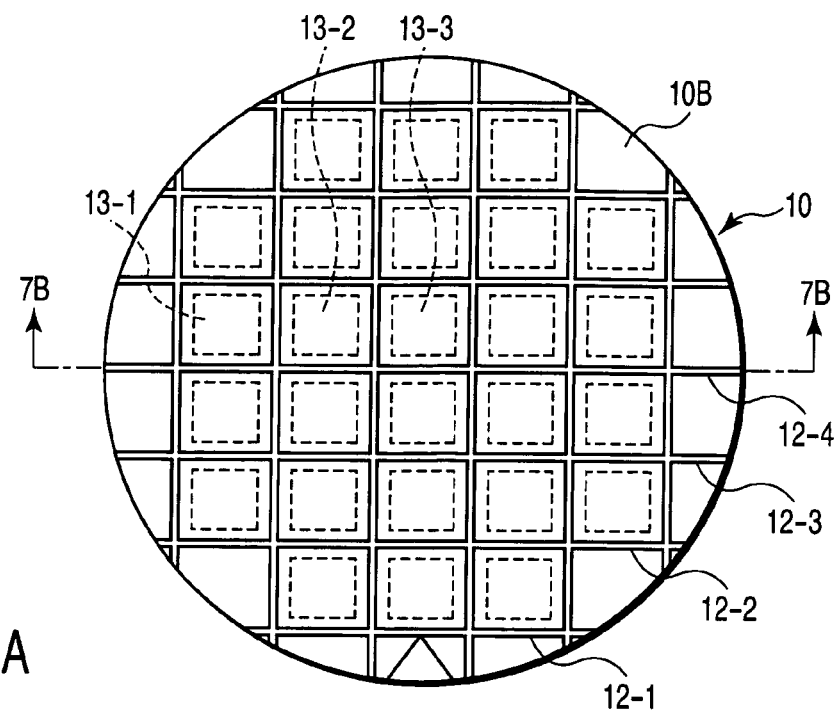
FIG. 7A is a plan view of the backside of a wafer in which grooves have been made.
Figure 7B:
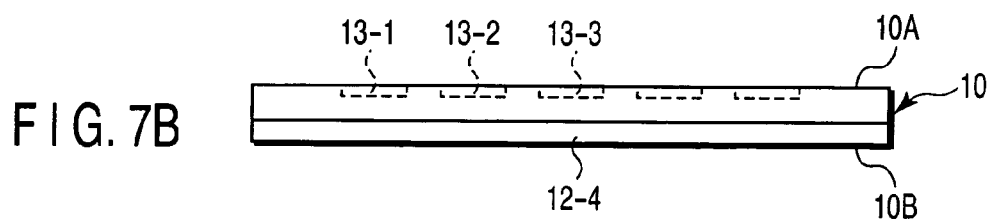
FIG. 7B is a sectional view taken along line 7B-7B of FIG. 7A.
Figure 8A:
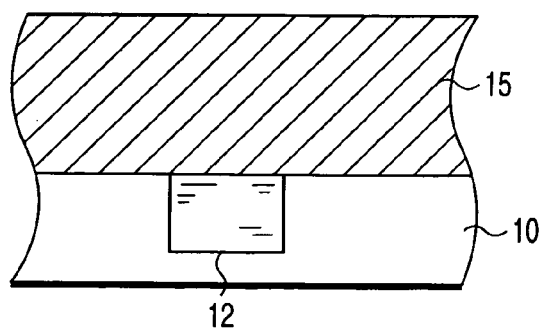
FIGS. 8A and 8B are enlarged sectional views of a groove in a heating (or cooling) step.
Figure 8B:
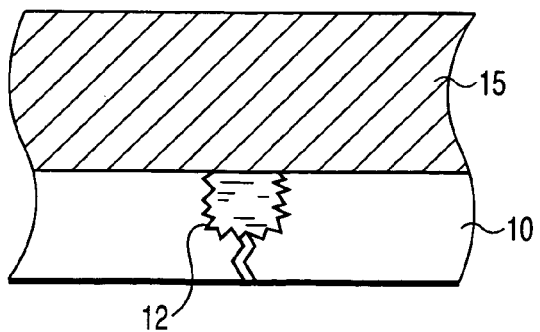

FIGS. 1 to 6, 7A, 7B, 8A, 8B, and 9 are diagrams to help explains a semiconductor device manufacturing method and a semiconductor device manufacturing apparatus according to a first embodiment of the present invention. FIGS. 1 to 6 are perspective views to help explain the manufacturing steps sequentially. FIGS. 7A and 7B are a plan view of the backside of a wafer in which grooves have been made and its sectional view, respectively. FIGS. 8A and 8B are enlarged sectional views of a groove in a heating (or cooling) step. FIG. 9 is a process flowchart.

Figure 1:
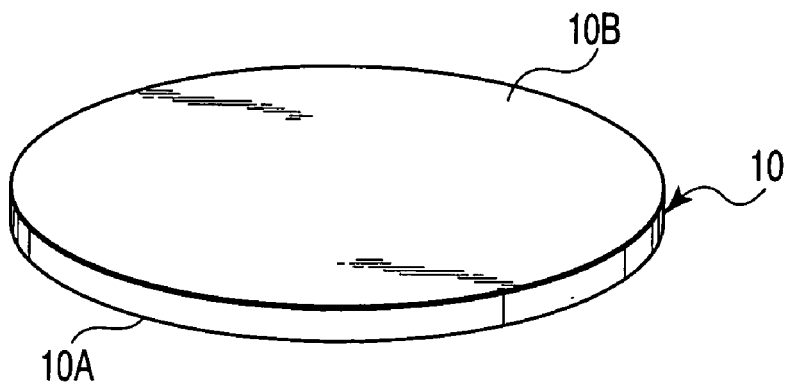
FIGS. 1 to 6 are perspective views showing a first to a sixth manufacturing step to help explain a semiconductor device manufacturing method according to a first embodiment of the present invention.

As shown in FIG. 1, various semiconductor elements are formed at the main surface 10A of a wafer 10 by known processing steps (STEP 1).

Figure 2:
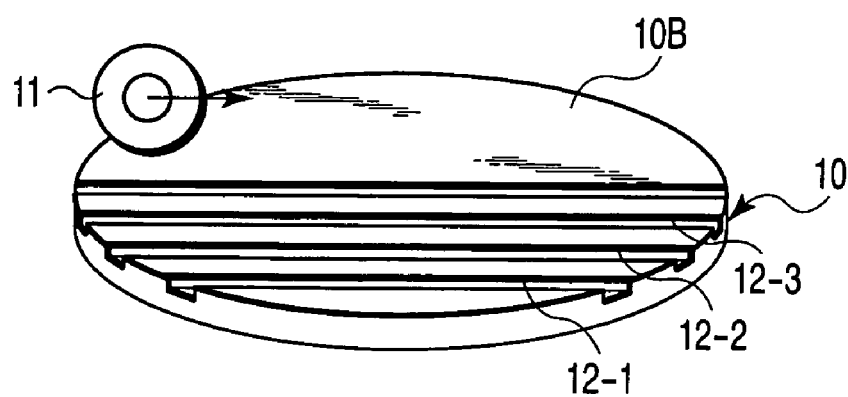

Thereafter, in the backside 10B of the wafer 10, grooves 12-1, 12-2, 12-3, . . . are made along chip dividing lines or dicing lines with a grinder 11 as shown in FIG. 2 (STEP 2). For example, if the wafer 10 has a diameter of 8 inches and a thickness of 760 μm, the depth of grooves 12-1, 12-2, 12-3, . . . is set to at least 560 μm. That is, the wafer 10 remaining under the grooves 12-1, 12-2, 12-3, . . . is 200 μm or less in thickness. These grooves 12-1, 12-2, 12-3, . . . are made along the cleaved surfaces and serve as a starting point for cleavage. After the grooves 12-1, 12-2, 12-3, . . . have been formed, cell-shaped regions serving as a starting point for cleavage are formed at the backside 10B of the wafer 10 corresponding to the outer circumference of the chips 13-1, 13-2, 13-3, . . . as shown in FIGS. 7A and 7B.

Figure 3:
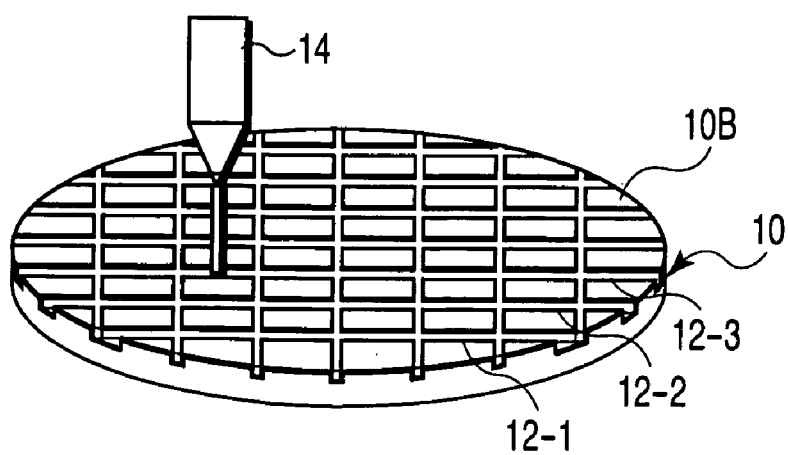

Next, as shown in FIG. 3, liquid matter including any one of water, liquid resin, and a chemical is injected from a nozzle 14 into the grooves 12-1, 12-2, 12-3, . . . (STEP 3). It is desirable that the liquid matter should include as few impurities as possible. For example, pure water should be used instead of ordinary water.

Figure 4:
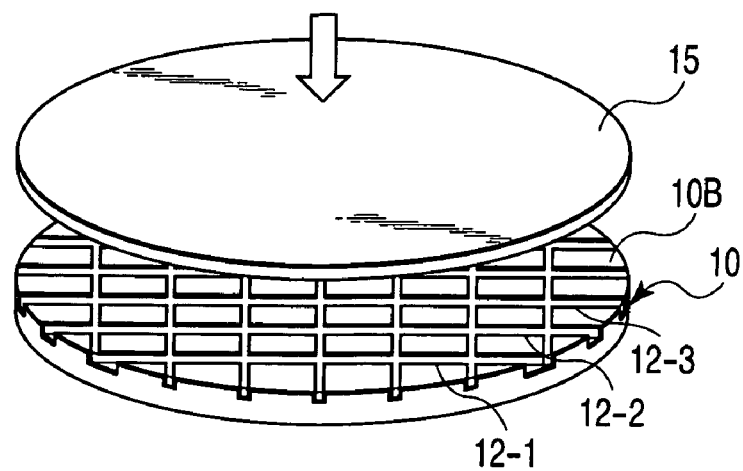

Thereafter, as shown in FIG. 4, a heating (or cooling) plate 15 is brought into close contact with the backside 10B of the wafer 10 (STEP 4). The plate 15 is made of iron or stainless steel whose quality doesn't change even when being heated (or cooled). While in FIG. 4, the plate 15 has the same shape and same size as those of the wafer 10, its shape and size are not necessarily the same, as long as the plate 15 can cover the backside 10B of the wafer 10 completely.

Then, as shown in FIG. 5, the heating (or cooling) plate 15 heats (or cools) the liquid matter (STEP 5). When pure water as the liquid matter is injected into the grooves 12-1, 12-2, 12-3, . . . , the pure water expands or vaporizes into water vapor as a result of heating as shown in FIG. 8A. As shown in 8B, cleavage takes place, with the grooves 12-1, 12-2, 12-3, . . . as a starting point. Alternatively, when pure water has frozen as a result of cooling, its volume expands, causing cleavage to take place, with the grooves 12-1, 12-2, 12-3, . . . as a starting point.

Thereafter, as shown in FIG. 6, removing the heating (or cooling) plate 15 causes the wafer 11 to be divided into individual chips 13-1, 13-2, 13-3, . . . (STEP 6).

Then, not only is the backside 10B of the wafer 10 made thinner by grinding (BSG), but also the damaged layer produced when the grooves 12-1, 12-2, 12-3, . . . were made is removed (STEP 7).

With this manufacturing method, since mechanical external force is not applied at the time of cleaving, it is possible to divide the wafer 10 without applying more force than necessary to the wafer 10. Therefore, a crack or chip in the wafer is less liable to occur. In addition, the interference between semiconductor chips is less liable to cause a crack or a chip. As a result, the production yield can be improved. Moreover, since a single wafer can be divided by cleaving the wafer from a plurality of positions at a time, the time required to carry out the dividing step can be shortened.

SECOND EMBODIMENT

Figure 10A:
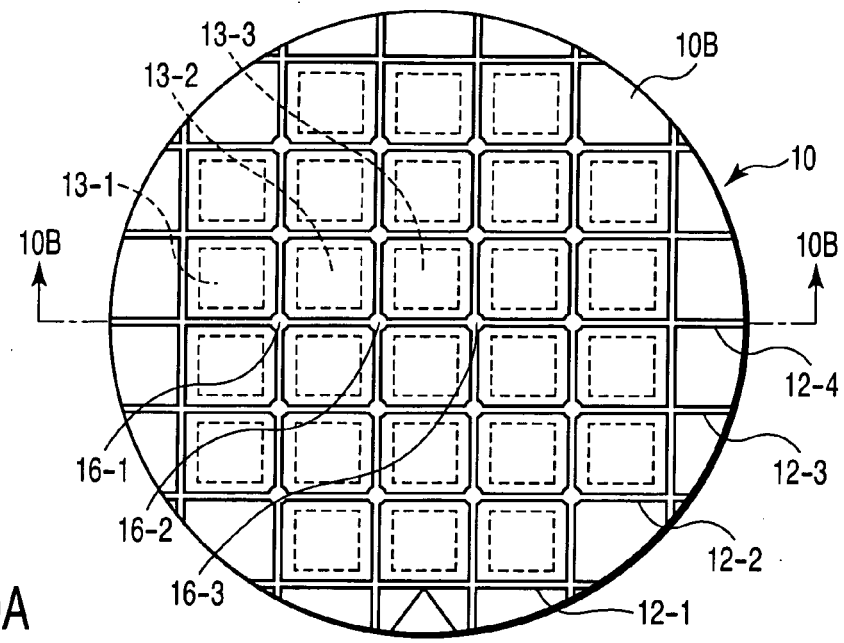
FIG. 10A is a plan view of the backside of a wafer to help explain a semiconductor device manufacturing method and apparatus according to a second embodiment of the present invention.
Figure 10B:
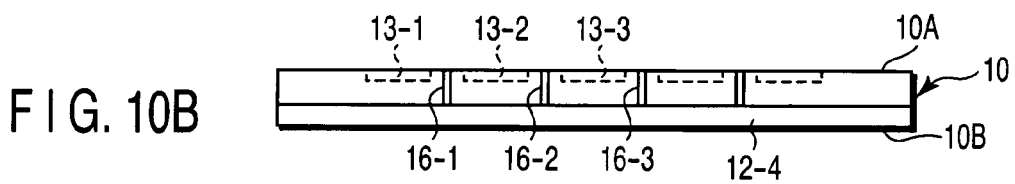
FIG. 10B is a sectional view taken along line 10B-10B of FIG. 10A.

FIGS. 10A and 10B are diagrams to help explain a semiconductor device manufacturing method and a semiconductor device manufacturing apparatus according to a second embodiment of the present invention. FIGS. 10A and 10B correspond to FIGS. 7A and 7B, respectively. In addition to the grooves 12-1, 12-2, 12-3, . . . in the backside 10B of the wafer 10, guide through holes 16-1, 16-2, 16-3, . . . to guide the progress of cleavage are made in the corners of the respective chips 13-1, 13-2, 13-3, . . . in the second embodiment.

The remaining manufacturing steps are the same as those in the first embodiment.

With this manufacturing method, the progress of cleavage can be guided in one direction by the through holes 16-1, 16-2, 16-3, . . . , which enables more accurate cleavage.

THIRD EMBODIMENT

Figure 11A:
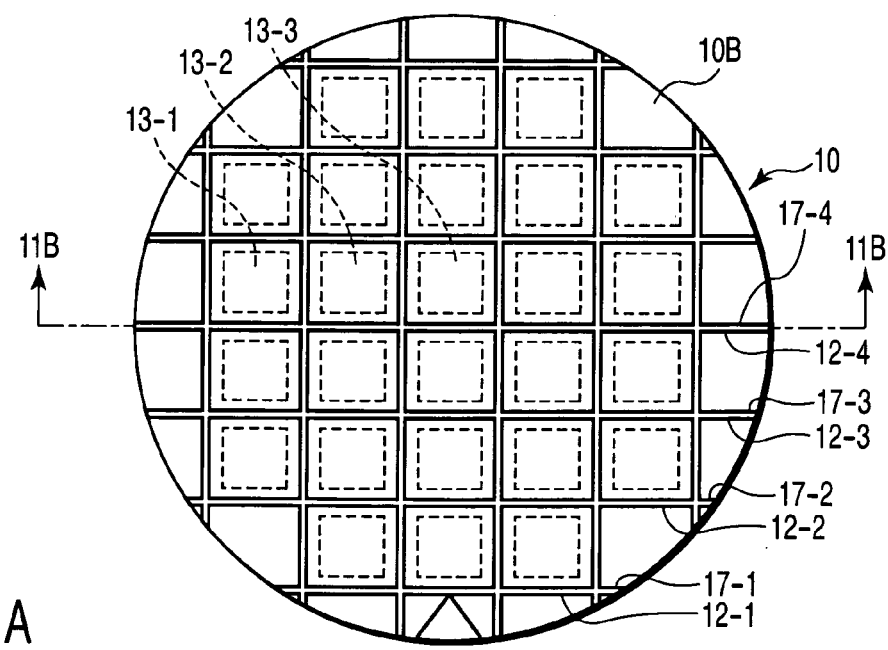
FIG. 11A is a plan view of the backside of a wafer to help explain a semiconductor device manufacturing method and apparatus according to a third embodiment of the present invention.
Figure 11B:
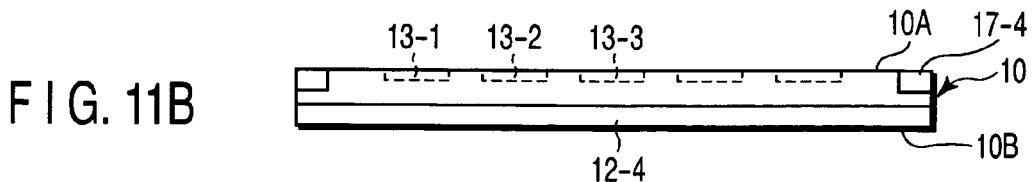
FIG. 11B is a sectional view taken along line 11B-11B of FIG. 11A.

FIGS. 11A and 11B are diagrams to help explain a semiconductor device manufacturing method and a semiconductor device manufacturing apparatus according to a third embodiment of the present invention. FIGS. 11A and 11B correspond to FIGS. 7A and 7B, respectively. In addition to the grooves 12-1, 12-2, 12-3, . . . in the backside 10B of the wafer 10, grooves 17-1, 17-2, 17-3, . . . are made in the main surface (or the element formation face) of the periphery of the wafer.

The remaining manufacturing steps are the same as those in the first and second embodiments.

With this manufacturing method, cleavage is caused to progress from the periphery of the wafer 10 toward the central part, which enables accurate cleavage.

FOURTH EMBODIMENT

Figure 12A:
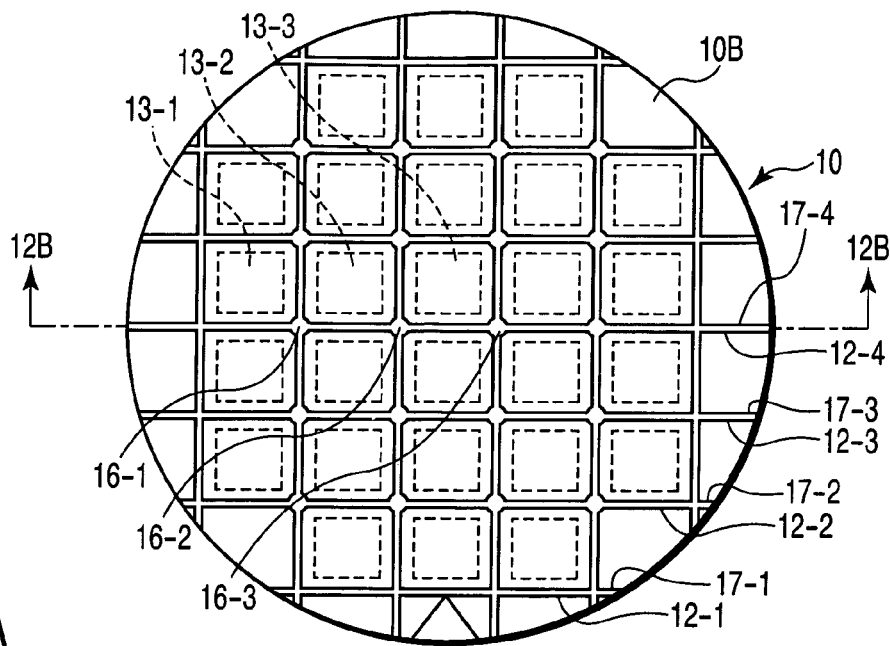
FIG. 12A is a plan view of the backside of a wafer to help explain a semiconductor device manufacturing method and apparatus according to a fourth embodiment of the present invention.
Figure 12B:
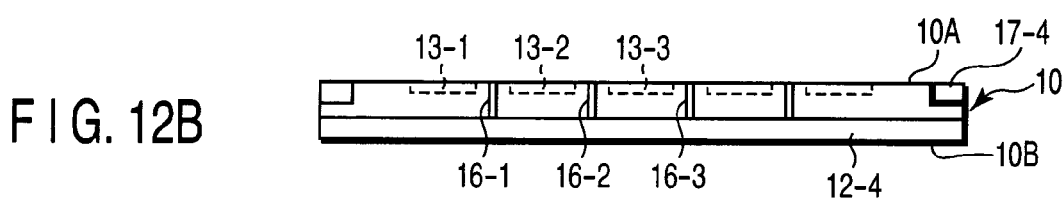
FIG. 12B is a sectional view taken along line 12B-12B of FIG. 12A.

FIGS. 12A and 12B are diagrams to help explain a semiconductor device manufacturing method and a semiconductor device manufacturing apparatus according to a fourth embodiment of the present invention. FIGS. 12A and 12B correspond to FIGS. 7A and 7B, respectively. The fourth embodiment is a combination of the first to third embodiments. In addition to the grooves 12-1, 12-2, 12-3, . . . in the backside 10B of the wafer 10, not only are guide through holes 16-1, 16-2, 16-3, . . . to guide the progress of cleavage made in the corners of the respective chips 13-1, 13-2, 13-3, . . . , but also grooves 17-1, 17-2, 17-3, . . . are made in the main surface (or the element formation face) of the periphery of the wafer.

The remaining manufacturing steps are the same as those in the first to third embodiments.

With this manufacturing method, cleavage is caused to progress from the periphery of the wafer 10 toward the central part with the help of the guide through holes 16-1, 16-2, 16-3, . . . , which achieves more accurate cleavage easily.

FIFTH EMBODIMENT

Figure 13A:
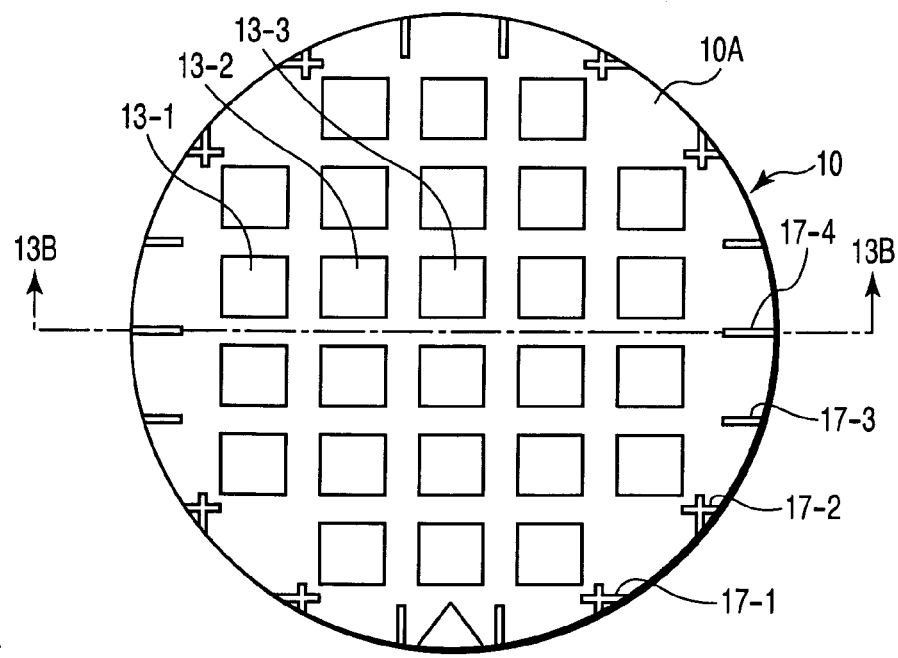
FIG. 13A is a plan view of the backside of a wafer to help explain a semiconductor device manufacturing method and apparatus according to a fifth embodiment of the present invention.
Figure 13B:
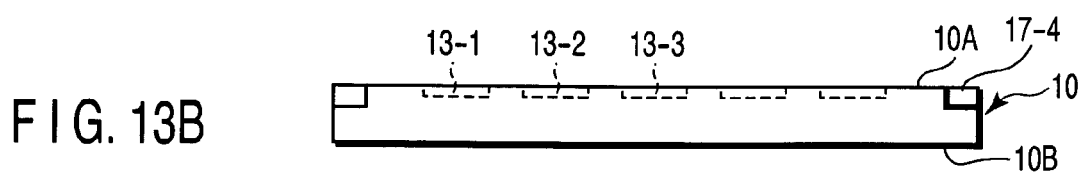
FIG. 13B is a sectional view taken along line 13B-13B of FIG. 13A.

FIGS. 13A and 13B are diagrams to help explain a semiconductor device manufacturing method and a semiconductor device manufacturing apparatus according to a fifth embodiment of the present invention. FIGS. 13A and 13B correspond to FIGS. 7A and 7B, respectively. In the fifth embodiment, grooves 17-1, 17-2, 17-3, . . . are made in the main surface (or element formation face) of the periphery of the wafer 10.

The remaining manufacturing steps are the same as those in the first to fourth embodiments.

Even with this manufacturing method, cleavage is caused to progress from the periphery of the wafer toward the central part, thereby dividing the wafer.

SIXTH EMBODIMENT

FIGS. 14A and 14B are diagrams to help explain a semiconductor device manufacturing method and a semiconductor device manufacturing apparatus according to a sixth embodiment of the present invention. FIGS. 14A and 14B correspond to FIGS. 7A and 7B, respectively. In the sixth embodiment, grooves 17-1, 17-2, 17-3, . . . are made in the main surface (or element formation face) of the periphery of the wafer 10 and guide through holes 16-1, 16-2, 16-3, . . . to guide the progress of cleavage are made in the corners of the respective chips 13-1, 13-2, 13-3, . . . .

The remaining manufacturing steps are the same as those in the first to fifth embodiments.

Even with this manufacturing method, cleavage is caused to progress from the periphery of the wafer 10 toward the central part and the progress of cleavage is guided in one direction by the through holes 16-1, 16-2, 16-3, . . . , which enables accurate cleavage.

This invention is not limited to the first to sixth embodiments and may be embodied in still other ways.

[Modification 1]

For example, while in the above embodiments, the matter injected into the grooves 12-1, 12-2, 12-3, . . . , 17-1, 17-2, 17-3, . . . , and through holes 16-1, 16-2, 16-3, . . . has been pure water, it is, of course, possible to use another liquid matter which is changed physically by an external factor, such as liquid resin or a chemical. Moreover, as long as matter is changed physically by a certain factor (i.e., heat), it may be solid resin of such a size as fits into the grooves, instead of liquid. Using resin as the liquid matter enables the semiconductor chips 13-1, 13-2, 13-3, . . . to be protected and improved in strength as a result of the resin used for cleavage adhering to the side faces of the semiconductor chips and remaining there.

[Modification 2]

The positions in the wafer surface of, the number of, the size of, and the like of the grooves 12-1, 12-2, 12-3, . . . , 17-1, 17-2, 17-3, . . . and through holes 16-1, 16-2, 16-3, . . . made in the wafer 10 are not limited to the above embodiments. They may be so determined that cleaving can be performed and all of the side faces of the chips 13-1, 13-2, 13-3, . . . have cleaved surfaces.

For example, when the chip size is small, the wafer may be divided using only through holes 16-1, 16-2, 16-3, . . .

[Modification 3]

In making the grooves 12-1, 12-2, 12-3, . . . , 17-1, 17-2, 17-3, . . . , and through holes 16-1, 16-2, 16-3, . . . , not only the grinder 11 explained in each of the above embodiments but also a diamond scriber or a diamond blade may be used. Moreover, not only these physical methods but also a chemical method, such as etching, and an optical method, such as a laser beam, may be used, as long as grooves or through holes of such a size as enables liquid matter to be injected into can be made.

[Modification 4]

The shape of the cross section of the grooves 12-1, 12-2, 12-3, . . . , 17-1, 17-2, 17-3, . . . may be not only square but also of other various shapes, including a step-like shape as shown in FIG. 16, a triangular shape as shown in FIG. 17, a bevel-edge-like shape as shown in FIG. 18, and a linear shape (a modified layer produced by irradiation of a laser beam) as shown in FIG. 19.

As described above, in the semiconductor device manufacturing method and apparatus according to each of in the first to sixth embodiments and the first to fourth modification, since a semiconductor wafer is divided without the application of mechanical external force, the wafer is cleaved without the application of more force than necessary, with the result that the wafer is less liable to crack or chip and the interference between semiconductor chips is also less liable to cause a crack or a chip. Accordingly, the production yield is improved. Furthermore, since a single wafer can be cleaved and divided at a time, the time required to carry out the dividing step can be shortened.

Therefore, according to an aspect of this invention, it is possible to provide a semiconductor device manufacturing method and a semiconductor device manufacturing apparatus which are capable of improving the production yield and shortening the time required to carry out the dividing step.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wafer dividing method comprising:
    forming a starting point for cleavage made up of at least one of a groove and a through hole on a chip dividing line or a dicing line along the cleaved surface of a wafer;
    injecting liquid matter into the starting point for cleavage; and
    vaporizing the liquid matter by heating the liquid matter, whereby the liquid matter is expanded to cleave the wafer so as to divide the wafer into semiconductor chips.

2. The wafer dividing method according to claim 1, wherein the starting point for cleavage is for forming at least one of the groove and the through hole by any one of a mechanical process, a chemical process, and an optical process performed on the wafer or by a combination of these processes.

3. The wafer dividing method according to claim 1, wherein the liquid matter includes any one of water, liquid resin, and a chemical.

4. The wafer dividing method according to claim 1, wherein the liquid matter is pure water.

5. The wafer dividing method according to claim 1, wherein the heating is performed by bringing a heating plate into close contact with the backside of the wafer.

6. The wafer dividing method according to claim 1, wherein the external factor that changes the liquid matter physically is heat and cooling is used to solidify the liquid matter to expand the matter.

7. The wafer dividing method according to claim 6, wherein the cooling is performed by bringing a cooling plate into close contact with the backside of the wafer.

8. A semiconductor device manufacturing method comprising:
    forming a region serving as a starting point for cleavage made up of at least one of a groove and a through hole on a chip dividing line or a dicing line along the cleaved surface of a wafer in which semiconductor elements are formed;
    injecting liquid matter into the region serving as a starting point for cleavage; and
    vaporizing the liquid matter by heating the liquid matter, whereby the liquid matter is expanded to cleave the wafer so as to divide the wafer into semiconductor chips.

9. The semiconductor device manufacturing method according to claim 8, wherein the region serving as a starting point for cleavage is for forming at least one of the groove and the through hole by any one of a mechanical process, a chemical process, and an optical process performed on the wafer or by a combination of these processes.

10. The semiconductor device manufacturing method according to claim 8, wherein the liquid matter includes any one of water, liquid resin, and a chemical.

11. The semiconductor device manufacturing method according to claim 8, wherein the liquid matter is pure water.

12. The semiconductor device manufacturing method according to claim 8, wherein the heating is performed by bringing a heating plate into close contact with the backside of the wafer.

13. The semiconductor device manufacturing method according to claim 8, wherein the external factor that changes the liquid matter physically is heat and cooling is used to solidify the liquid matter to expand the matter.

14. The semiconductor device manufacturing method according to claim 13, wherein the cooling is performed by bringing a cooling plate into close contact with the backside of the wafer.

15. A wafer dividing apparatus comprising:
    a first mechanism configured to form a region serving as a starting point for cleavage made up of at least one of a groove and a through hole on a chip dividing line or a dicing line along the cleaved surface of a wafer;
    a second mechanism configured to inject liquid matter into the region serving as the starting point for cleavage; and
    a third mechanism configured to vaporize the liquid matter by heating the liquid matter, whereby an expansion of the liquid matter is used to cleave the wafer so as to divide the wafer into semiconductor chips.

16. A semiconductor device manufacturing apparatus comprising:
    means for forming a region serving as a starting point for cleavage made up of at least one of a groove and a through hole on a chip dividing line or a icing line along the cleaved surface of a wafer in which semiconductor elements are formed;
    means for injecting liquid matter into the region serving as a starting point for cleavage; and
    means for vaporizing the liquid matter by heating the liquid matter, whereby an expansion of the liquid matter is used to cleave the wafer so as to divide the wafer into semiconductor chips.

* * * * *